(12) United States Patent
Swanson

(10) Patent No.: US 7,269,685 B2
(45) Date of Patent: Sep. 11, 2007

(54) APPARATUS AND METHODS FOR STORING DATA IN A MAGNETIC RANDOM ACCESS MEMORY (MRAM)

(75) Inventor: Richard W. Swanson, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 526 days.

(21) Appl. No.: 10/932,814

(22) Filed: Sep. 2, 2004

(65) Prior Publication Data

US 2006/0044868 A1 Mar. 2, 2006

(51) Int. Cl.
*G06F 12/00* (2006.01)
(52) U.S. Cl. .......................... 711/104; 711/167
(58) Field of Classification Search ................ 711/104, 711/167
See application file for complete search history.

(56) References Cited

U.S. PATENT DOCUMENTS

| | | | |
|---|---|---|---|
| 3,375,503 A * | 3/1968 | Bertelsen | .................... 365/173 |
| 5,894,447 A | 4/1999 | Takashima | |
| 5,946,227 A | 8/1999 | Naji | |
| 6,462,983 B2 | 10/2002 | Katti | |
| 2005/0276100 A1* | 12/2005 | Yang et al. | .................. 365/171 |
| 2006/0171196 A1* | 8/2006 | Freitag et al. | .............. 365/158 |

* cited by examiner

*Primary Examiner*—Donald Sparks
*Assistant Examiner*—Jesse Diller
(74) *Attorney, Agent, or Firm*—Knobbe Martens Olson & Bear LLP

(57) ABSTRACT

An apparatus and methods store data in a magnetic random access memory (MRAM) in a fast and efficient manner. Embodiments advantageously decrease the number of clock cycles required to store data by eliminating at least one wait state in a transition from a read state to a write state. Embodiments advantageously enhance the throughput of the MRAM and a related digital circuit, such as a computer system, which advantageously enhances the operating speed of the digital circuit.

29 Claims, 4 Drawing Sheets

APPARATUS AND METHODS FOR STORING DATA IN A MAGNETIC RANDOM ACCESS MEMORY (MRAM)

BACKGROUND OF THE INVENTION

1. Field of the Invention

The invention generally relates to memory. In particular, the invention relates to writing data to a magnetic random access memory (MRAM) device.

2. Description of the Related Art

Computers and other digital systems use memory to store programs and data. A common form of memory is random access memory (RAM), such as dynamic random access memory (DRAM) devices and static random access memory (SRAM) devices. DRAM devices and SRAM devices are volatile memories. A volatile memory loses its data when power is removed. For example, when a conventional personal computer is powered off, the volatile memory is reloaded through a boot up process when power is restored. In addition, certain volatile memories such as DRAM devices require periodic refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable PROM (EPROM), electrically erasable PROM (EEPROM), flash memory, and the like. Disadvantageously, conventional nonvolatile memories are relatively large, slow, and expensive. Further, conventional nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetic random access memory (MRAM). An MRAM device uses magnetic orientations to retain data in its memory cells. Advantageously, MRAM devices are relatively fast, are nonvolatile, consume relatively little power, and do not suffer from a write cycle limitation. There are at least three different types of MRAM devices, including giant magneto-resistance (GMR) MRAM devices, pseudo spin valve (PSV) MRAM devices, and magnetic tunnel junction (MTJ) or tunneling magneto-resistance (TMR) MRAM devices.

A GMR MRAM device separates at least two ferromagnetic layers with a metallic spacer layer, such as a copper spacer layer. Magnetic vectors in one layer are magnetically fixed or pinned, while the magnetic vectors of the other magnetic layer can be switched to change the magnetization direction. The resulting change in resistance is used to store data. A PSV MRAM device uses an asymmetric sandwich of the ferromagnetic layers and metallic layer as a memory cell so that the ferromagnetic layers do not switch at the same time. A hard layer is used to store data, and a soft layer is used to read the data. The cells of GMR MRAM devices and PSV MRAM devices can be arranged in arrays.

In an MTJ MRAM device, at least two ferromagnetic layers are separated by a thin insulating tunnel barrier, such as a layer of aluminum oxide. Electrons pass relatively more freely when the magnetic orientations of the layers are aligned and relatively less freely when the magnetic directions of the layers are not aligned. One exemplary configuration for an MTJ MRAM memory device is a "cross-point" memory array, which comprises a first set of parallel conductive lines covered by an insulating layer, over which lies a second set of parallel conductive lines, which are perpendicular to the first lines. One set of conductive lines is referred to as the "bit" lines, and the other set of conductive lines is referred to as the "word" lines. The magnetic memory cells are sandwiched between the bit lines and the word lines at their intersections.

In an exemplary digital device, such as a computer system, an MRAM device is typically electrically coupled to a bi-directional I/O bus. However, it will be understood that an MRAM device can be configured to be read only and that an MRAM device can also be electrically coupled to a processor, a CPU, or other control unit without the benefit of a bus. MRAM devices can also be integrated with processors, such as microcontrollers and other integrated circuits.

In a memory read cycle, a selected MRAM device places data on the bus to be read by a processor or by other components (e.g., a component that accesses the MRAM device using direct memory access (DMA)). In a memory write cycle, a selected MRAM device receives data from the bus and stores the data within magnetoresistive cells of a memory array.

In a conventional MRAM device, a wait state is inserted between a read cycle and a write cycle to avoid bus contention. While bus contention is desirably avoided, the wait state disadvantageously slows down the throughput of the MRAM device. As a result, the processing speed of the digital device utilizing the MRAM is reduced.

SUMMARY OF THE INVENTION

Apparatus and methods advantageously store data in a magnetic random access memory (MRAM) in a relatively fast and efficient manner. Embodiments can advantageously decrease the number of clock cycles used to store data by eliminating at least one wait state in a transition from a memory read state to a memory write state. This advantageously enhances throughput of the MRAM and/or a related digital circuit, such as a computer system, which advantageously enhances the speed of the digital circuit.

One embodiment is a method of writing data in a magnetic random access memory (MRAM). The MRAM includes a magnetoresistive array of bits. A bit of the magnetoresistive array stores one of a first state or a second state, where the second state is a logical inverse of the first state. The method includes receiving an address, where the address corresponds to a selected portion (e.g., word) of the bits of the magnetoresistive array within the MRAM. The method further includes receiving a control signal to perform a write operation for the selected bits, and writing the first state to all of the selected bits of the magnetoresistive array at least partially in response to receiving the control signal. The method further includes inputting a word of data intended to be written to the selected bits of the magnetoresistive array at least partially in response to receiving the control signal, and selectively overwriting zero or more of the selected bits, where the zero or more of the selected bits correspond to zero or more bits of the word that have the second state.

One embodiment is a method of exchanging data in a magnetic random access memory (MRAM), where the method includes reading data from the MRAM in a read cycle, and writing data to the MRAM in a write cycle. In accordance with the method, the write cycle immediately follows the read cycle without a wait state between the read cycle and the write cycle.

One embodiment is a method of exchanging data in a magnetic random access memory (MRAM), where the method includes reading data from the MRAM in a read cycle, and writing data to the MRAIVI in a write cycle. In accordance with the method, the write cycle immediately follows the read cycle without a wait state between the read cycle and the write cycle, wherein writing data further comprises at least a first phase and a second phase, where in the first phase, a first state of data is written to all bits of a selected portion of the MRAM, and where in the second phase, a second state of data is overwritten over selected bits of the selected portion of the MRAM, where the selected bits correspond to data provided to the MRAM for storage.

One embodiment is a method of exchanging data in a magnetic random access memory (MRAM), where the method includes reading data from the MRAM in a read cycle, and writing data to the MRAM in a write cycle. In accordance with the method, the write cycle immediately follows the read cycle without a wait state between the read cycle and the write cycle, wherein writing data comprises: writing a first state of data to a selected portion of the MRAM, where the selected portion corresponds to a memory address; inputting the data to be written to the MRAM, where the data to be written corresponds to bits of data having a value of the first state or a second state; and writing the second state of data to selected bits of the selected portion of the MRAM, where the selected bits correspond to bits of the data to be written to the value of the second state.

One embodiment is an integrated circuit with a magnetic random access memory (MRAM), where the MRAM includes: a memory array of magnetoresistive cells, where a magnetoresistive cell is configured to store one of a first state or a second state. A decoder electrically is coupled to the memory array and is configured to select a portion (e.g., word) of the memory array at least partially in response to a provided address. Current drivers are electrically coupled to the selected portion of the memory array. The current drivers are configured to provide at least a write current in a first direction for writing of a first state of data and to provide at least a write current in a second direction for writing of a second state of data to selected bits of the selected portion. A read/write control circuit is configured to receive control signals for the MRAM. The read/write control circuit activates the current drivers in a first phase and in a second phase of a memory write cycle in response to the control signals. In the first phase, the first state of data is written to all of the selected bits of the selected portion. In the second phase, the second state of data is written to zero or more of the selected bits of the selected portion in accordance with values of corresponding bits in a word received by the MRAM.

One embodiment is a bus controller for a digital device, where the bus controller includes a first interface circuit electrically coupled to a processor and to a clock. The first interface circuit receives first control signals from the processor. A second interface circuit is at least partially responsive to the first control signals received by the first interface circuit. The second interface circuit is adapted to provide second control signals to a magnetic random access memory (MRAM), wherein at least partially in response to an assertion of a first memory write signal for the MRAM from the processor, the second interface circuit asserts a second memory write signal to the MRAM prior to a time when data to be written to the MRAM is valid on a data bus for the MRAM.

One embodiment is a system, where the system includes a control unit for performing a series of instructions, and a magnetic random access memory (MRAM) responsive to the control unit. The memory comprises a memory array of magnetoresistive cells and a control circuit. A magnetoresistive cell is configured to store one of a first state or a second state. The control circuit is configured to receive control signals for the MRAM. At least partially in response to an assertion of a memory write signal, the control circuit stores the first state to all of the bits of a selected word of the memory array in a first phase. In a second phase, the control circuit stores the second state of data selectively to zero or more of the bits of the selected word of the memory array according to a state of data for corresponding bits in a received word of the MRAM to be written to the MRAM.

One embodiment is a computer system. The computer system includes a processor, at least one storage device in communication with the processor, at least one input/output device in communication with the processor, and a magnetic memory device in communication with the processor. The magnetic memory device is configured to write a first state to a word of a magnetoresistive array irrespective of data to be stored therein. The magnetic memory device inputs data intended to be written to the word of the magnetoresistive array, and selectively overwrites zero or more bits of the word of the magnetoresistive array with zero or more bits corresponding to zero or more bits of data intended to be written that correspond to the second state.

BRIEF DESCRIPTION OF THE DRAWINGS

The foregoing features and other features of the invention are described herein with reference to the attached drawings, which are summarized below. The attached drawings and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention.

Embodiments advantageously store data in a magnetic random access memory (MRAM) in a relatively fast and efficient manner. The number of clock cycles used to store data is advantageously reduced by eliminating at least one wait state in a transition from a read state to a write state. Reducing the number of clock cycles advantageously enhances the throughput of the MRAM and a related digital circuit, such as a computer system.

Figure 1:
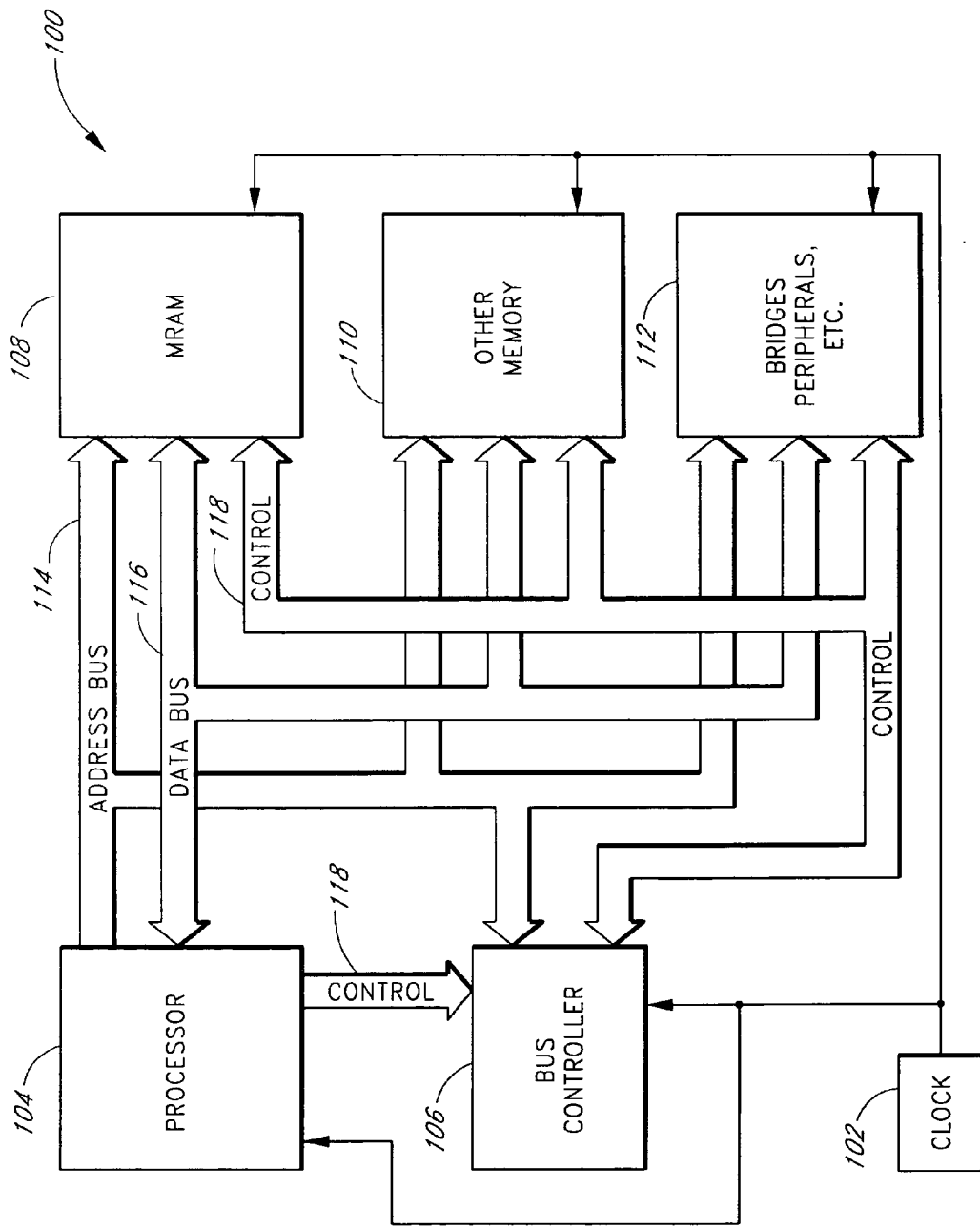
FIG. 1 is a schematic diagram illustrating a computer system according to an embodiment.

FIG. 1 is a schematic diagram illustrating a digital device 100 according to one embodiment. The illustrated digital device 100 includes a clock 102, a processor 104, a bus controller 106, an MRAM 108, another memory 110, and other devices (e.g., interfaces, such as bridges and peripherals) 112. The components communicate via at least one of an address bus 114, a data bus 116, control signals 118, or combinations thereof.

The clock 102 provides a reference for system timing. The processor 104 executes instructions and processes data, which can be provided from the MRAM 108, from the other memory 110, from the bridges and peripherals 112, or from a combination of such sources. The processor 104 typically controls the address bus 114, but it will be understood that in direct memory access architectures, other devices can control the address bus 114 as well. The bus controller 106 controls access to the data bus 116, can insert wait states, can provide upper address decoding from the address bus 114 for generating chip selects, and the like. The MRAM 108 can be used for program storage, for data storage, or for storing programs and data. The other memory 110 can correspond to a variety of other types of memories, such as to disk drives, to semiconductor memories, and the like. In one embodiment, the advantageous speed, density, and non-volatility characteristics of the MRAM 108 obviate the need for the other memory 110. The bridges and peripherals 112 can include interfaces to ports, to other buses, to visual displays, to audio output devices, to input devices, and the like.

It should be noted that numerous variations will be apparent to one of ordinary skill in the art for the digital device 100. For example, some embodiments of the digital device 100 can have more than the illustrated components (e.g., memory caches, interrupt controllers, communications devices, and the like). Other embodiments of the digital device 100 can have fewer components than those illustrated. In another example, it will be apparent that the bus controller 106 can be integrated with the processor 104 or can be part of another chip, such as part of a chipset.

The digital device 100 may be any microprocessor or processor (hereinafter referred to as processor) controlled device, including, but not limited to a personal computer, a terminal device, a workstation, a server, a client, a mini computer, a main-frame computer, a laptop computer, a network of individual computers, a mobile computer, a palm top computer, a hand held computer, a set top box for a TV, a video gaming console, an interactive television, an interactive kiosk, a personal digital assistant (PDA), an interactive wireless communications device, a mobile browser, a cellular telephone, a digital video player and/or recorder, a digital camera, a digital video camera, a digital audio player, such as an MP3 player, or a combination thereof.

The MRAM 108 can be embodied in a variety of ways. For example, the MRAM 108 can be embodied within the digital device 100, within a component of the digital device 100, such as the processor 104, or within a dedicated memory device (e.g., a memory chip, a memory module, a memory stick, a memory card, or the like).

Figure 2:
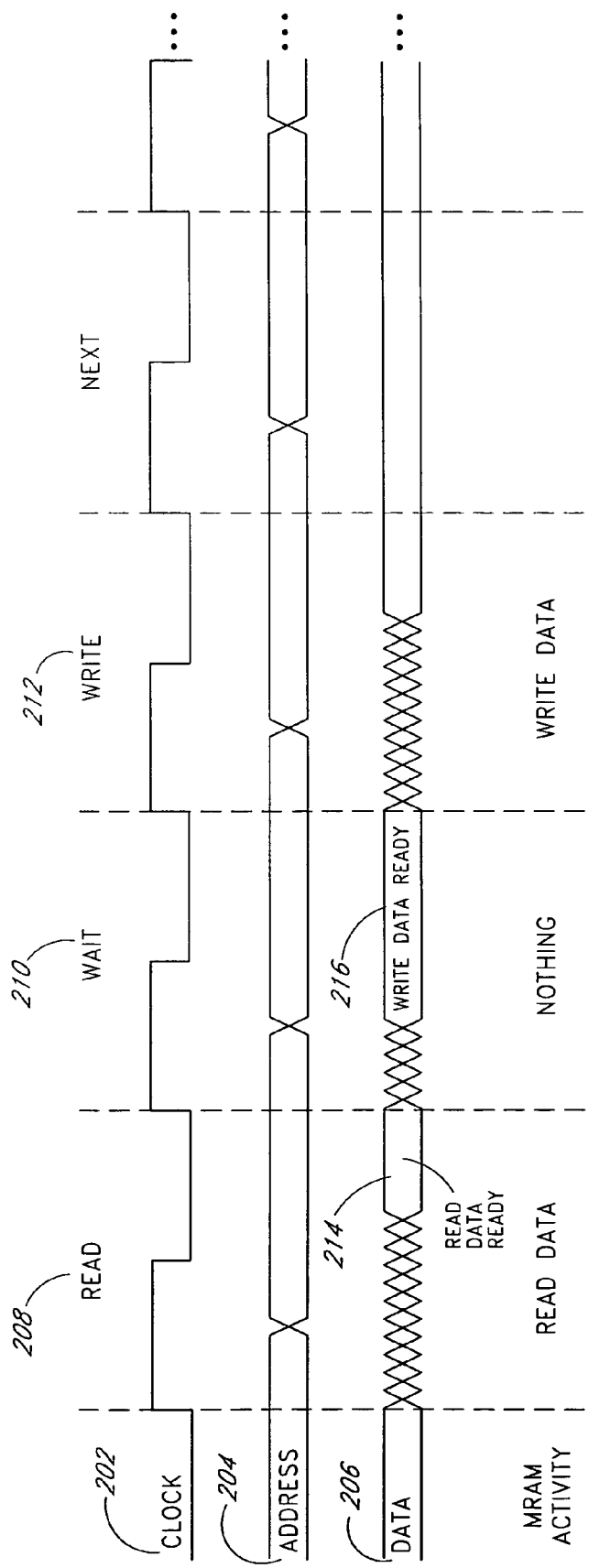
FIG. 2 is a timing diagram illustrating disadvantages of the prior art.

FIG. 2 is a timing diagram illustrating disadvantages of the prior art. Time increases from left to right along a horizontal axis. The timing diagram illustrates a clock waveform 202, an address waveform 204, and a data waveform 206. For purposes of illustration, the illustrated conventional system uses only the rising edge of the clock waveform 202 as a reference. It will be understood that the discussion applies equally to a system that uses a falling edge of the clock waveform 202 as a reference. A sequence of a read state 208, a wait state 210, and a write state 212 is shown. In the illustrated digital device 100, the bus controller 106 determines whether a particular memory device is in the read state 208, the wait state 210, or the write state 212 in response to instructions for data from the processor 104.

In the read state 208, the processor 104 requests a "memory read" from the MRAM 108. In response to the read request, the MRAM 108 latches the address as illustrated by the address waveform 204 corresponding to the requested data, and after performing a read from the memory array of the MRAM 108, provides the requested data on the data bus 116 for the processor 104 as indicated by a "read data ready" 214. For purposes of illustration, the read state 208 is shown as lasting one clock cycle of the clock waveform 202. It will be understood that the number of cycles used for a memory read can vary depending on a variety of factors, such as the speed of the memory and the period of the clock waveform 202.

In the wait state 210, the processor 104 places data to be written to the MRAM 108 on the data bus 116 as indicated by a "write data ready" 216. This permits the data to be written to the MRAM 108 to be present at the time of the rising edge of the clock waveform 202 for the write state 212. With a conventional MRAM device, the data should be present at the input of the MRAM 108 before the write state is asserted. In the illustrated digital device 100, the MRAM 108 is drawn as synchronous memory, but it will be understood that the timing principles also apply to asynchronous memory. With synchronous memory, a memory write signal will typically be asserted prior to the rising edge of the clock waveform 202, and becomes active within the MRAM 108 upon the rising edge of the clock waveform 202. With asynchronous memory, the bus controller 106 will typically assert a chip select signal and a memory write signal for the MRAM 108 at the appropriate time. When the MRAM 108 enters the write state 212, an appropriate portion of an MRAM array corresponding to the specified address is selected, and the data is written to the selected portion of the array. Typically, a first logic state is written with current flowing through at least one array electrode in a first direction, and a second logic state is written with current flowing in a second direction opposite to the first direction. This current is referred to herein as a "write current". For example, the array electrode can correspond to a sense line for a GMR or PSV device, and to a bit line for a MTJ device.

The inserted wait state 210 between the read state 208 and the write state 212 disadvantageously imposes an unused time interval that could otherwise be efficiently used by the digital device to perform a productive task, such as, for example, transfer data, process data, and the like. In contrast to conventional semiconductor memory devices, such as static RAM and dynamic RAM memory devices, conventional MRAM devices need the data to be set up prior to the assertion of the write state 212 to set up the internal current sources that are used to write the data to the MRAM. It should be noted that while the write state 212 is shown as completing in one clock cycle, it will be apparent that the write state 212 can require one or more cycles depending on a variety of factors, such as the speed of the MRAM 108, the period of the clock waveform 202, and the like.

With a conventional MRAM device, the wait state 210 cannot be eliminated. If, for example, the wait state 210 were to be eliminated, then the processor 104 would assert the write data at the same time that the MRAM 108 would assert the read data, resulting in bus contention and undesirable errors. In addition, it should be noted that conventional techniques used to reduce the time required to write data in other types of memory are typically not applicable to MRAM. For example, conventional asynchronous SRAM and DRAM writing techniques typically need the data to be valid for only a relatively narrow window during the write cycle in order to write the correct data into the memory cell.

Because MRAM cells are written by switching current from a first direction to a second direction depending on the state of the logic, these techniques are not applicable to MRAM devices. Advantageously, the MRAM techniques described herein obviate the need for the inefficient wait state 210.

An example of a technique used with synchronous DRAM includes the use of temporary registers. The address and data are loaded into temporary registers, and the synchronous DRAM is loaded from these temporary registers. The temporary registers hold data in a volatile manner, which is not a problem with DRAM because DRAM is also volatile. However, the volatility of the temporary register method is disadvantageous when used in combination with non-volatile memory such as MRAM, because the data can be lost if the power is turned off before the data is written to the non-volatile memory.

Figure 3:
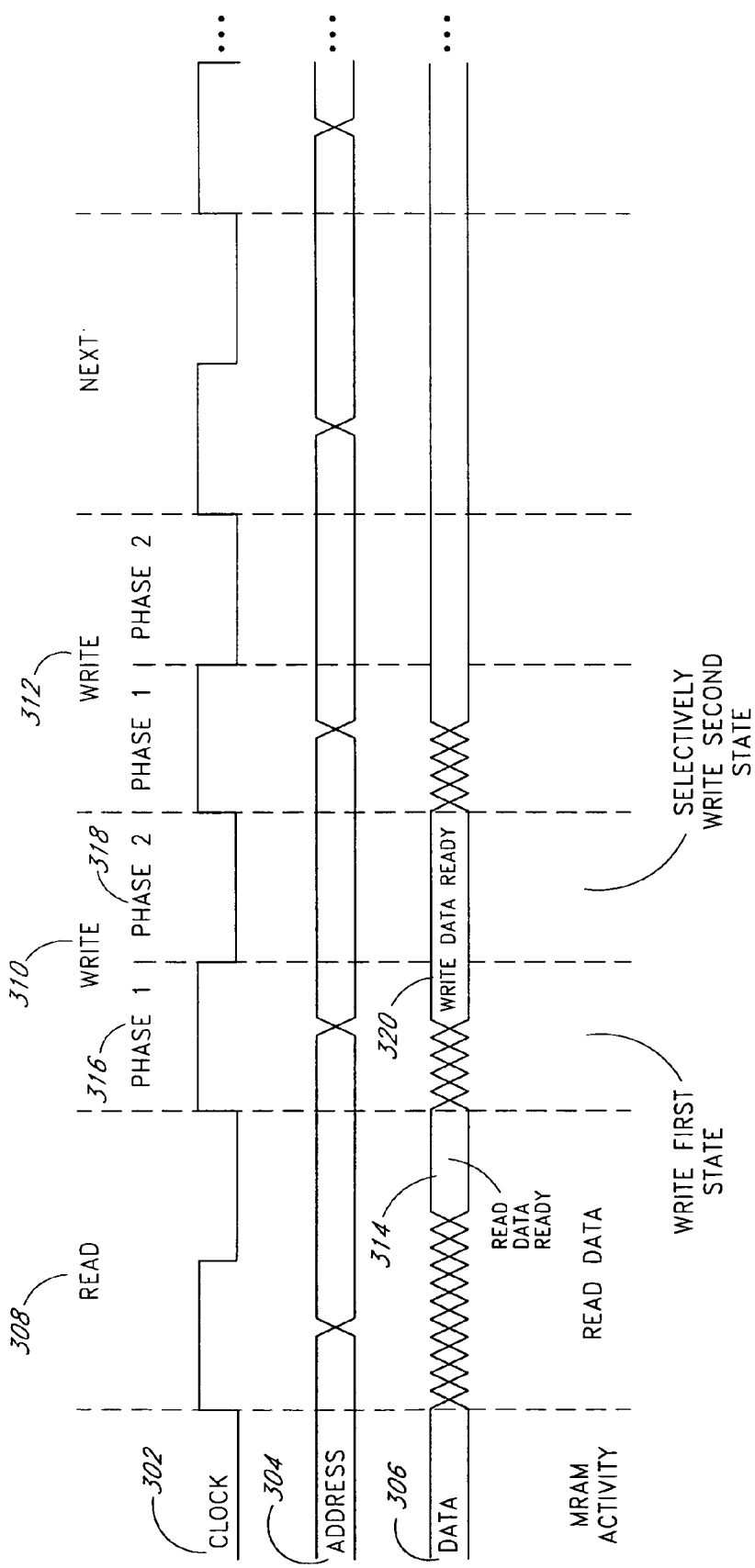
FIG. 3 is a timing diagram according to one embodiment.

FIG. 3 is a timing diagram illustrating advantages of an embodiment. Time increases from left to right along a horizontal axis. While illustrated in the context of a synchronous MRAM, it will be understood that the principles and advantages described herein are also applicable to an asynchronous MRAM.

The timing diagram illustrates a clock waveform 302, an address waveform 304, and a data waveform 306. For the purposes of illustration, the beginning of a state is referenced to the rising edge of the clock waveform 302, but it will be understood that the discussion applies equally to a system that uses a falling edge of the clock waveform 302 as a reference. A sequence of a read state 308, a write state 310, and another write state 312 is shown. Advantageously, the illustrated timing diagram avoids the inefficient wait state 210 described earlier in connection with FIG. 2.

In one embodiment, the read state 308 illustrated in the timing diagram of FIG. 3 is the same as the read state 208 illustrated in the timing diagram of FIG. 2. In the illustrated read state 308, the processor 104 requests a memory read from the MRAM 108. In response to the read request, the MRAM 108 latches the address as illustrated by the address waveform 304 corresponding to the requested data, and after performing a read from the memory array of the MRAM 108 for the word corresponding to the address, provides the requested data on the data bus 116 for the processor 104 as indicated by a "read data ready" 314. For the purposes of illustration, the read state 308 is shown lasting one clock cycle of the clock waveform 302. It will be understood that the number of cycles used for a memory read can vary depending on a variety of factors, such as the speed of the memory and the period of the clock waveform 302.

In accordance with the illustrated embodiment, the write state 310 immediately follows the read state 308 without an inefficient intervening wait state. The write state 310 is divided into two phases-a first phase 316 and a second phase 318. In the illustrated timing diagram, the first phase 316 is initiated at the rising edge of the clock waveform 302, and the second phase 318 is initiated at the falling edge of the clock waveform 302. In another embodiment, rather than using a second clock edge, an internal timer initiates the second phase 318 after the lapsing of a predetermined time following a first clock edge. For example, a predetermined time after the rising edge of the clock waveform 302, the second phase 318 can be initiated by the internal timer. In the illustrated timing diagram, the clock waveform 302 is drawn with an approximately 50% duty cycle so that the first phase 316 and the second phase 318 are approximately the same length in time. However, it will be understood that the clock waveform 302 can vary in duty cycle, such as, for example, correspond to a waveform with a 40%-60% duty cycle. It will also be understood that relatively high-speed clock waveforms can have relatively significant rise and fall times, which are not represented in the timing diagram for clarity. In another example, where the memory corresponds to an asynchronous MRAM, the second phase 318 can be initiated by a timer internal to the asynchronous memory or by a control signal from a memory controller.

In the write cycle 310, a portion of the memory array is selected according to the specified address on the address bus 114, and the data present on the data bus 116 is written to the array. The amount of data is typically referred to as a "word". The width of a word can be different in various embodiments. For example, in various embodiments, a word may comprise 4 bits, 8 bits, 16 bits, 32 bits, or the like. At the start of the write cycle 310, which is also the start of the first phase 316, the data to be written is not yet available to the MRAM 108. As indicated by the "write data ready" portion 320 of the data waveform 306, the data becomes available before the start of the second phase 318, which in the illustrated timing diagram coincides with the falling edge of the clock waveform 302. (It should be understood that the inverse of the clock waveform can also be used and further understood that the MRAM 108 can also be configured as an asynchronous MRAM under the control of the bus controller 106.)

In the first phase 316, a first state is written to all of the bits of the word for the selected portion of the memory array advantageously without regard to the actual value of the word to be written to the memory array. This permits the process of writing data to begin before the value of the data is known. The first state can correspond to a logic "0" or to a logic "1", so that after completion of the first phase 316, all of the bits of the selected word in the array are set to a first state (e.g., to all zeroes or to all ones). A bit can also be written with a second state of data that is opposite to the first state. For example, where the first state is a logic "1", the second state is a logic "0".

At the beginning of the second phase 318, the MRAM 108 inputs the data on the data bus 116 and writes the second state of data only for those bits of the word having data corresponding to the second state. It will also be understood by one of ordinary skill in the art that the data on the data bus 116 can also be latched at an appropriate time, and the MRAM 108 can input the data from the data latch rather than directly from the data bus 116. Thus, the MRAM 108 overwrites the first state with the second state in the memory cells corresponding to those bits.

As illustrated in the timing diagrams of FIG. 3, the process can continue with another write state 312. Alternatively, if additional write data is not available, the process ends at the completion of the first write cycle.

The above-described two-phase write cycle with data load in approximately the middle of the write cycle advantageously permits an inefficient wait state to be avoided, thereby enhancing the speed and performance of the digital device.

Figure 4:
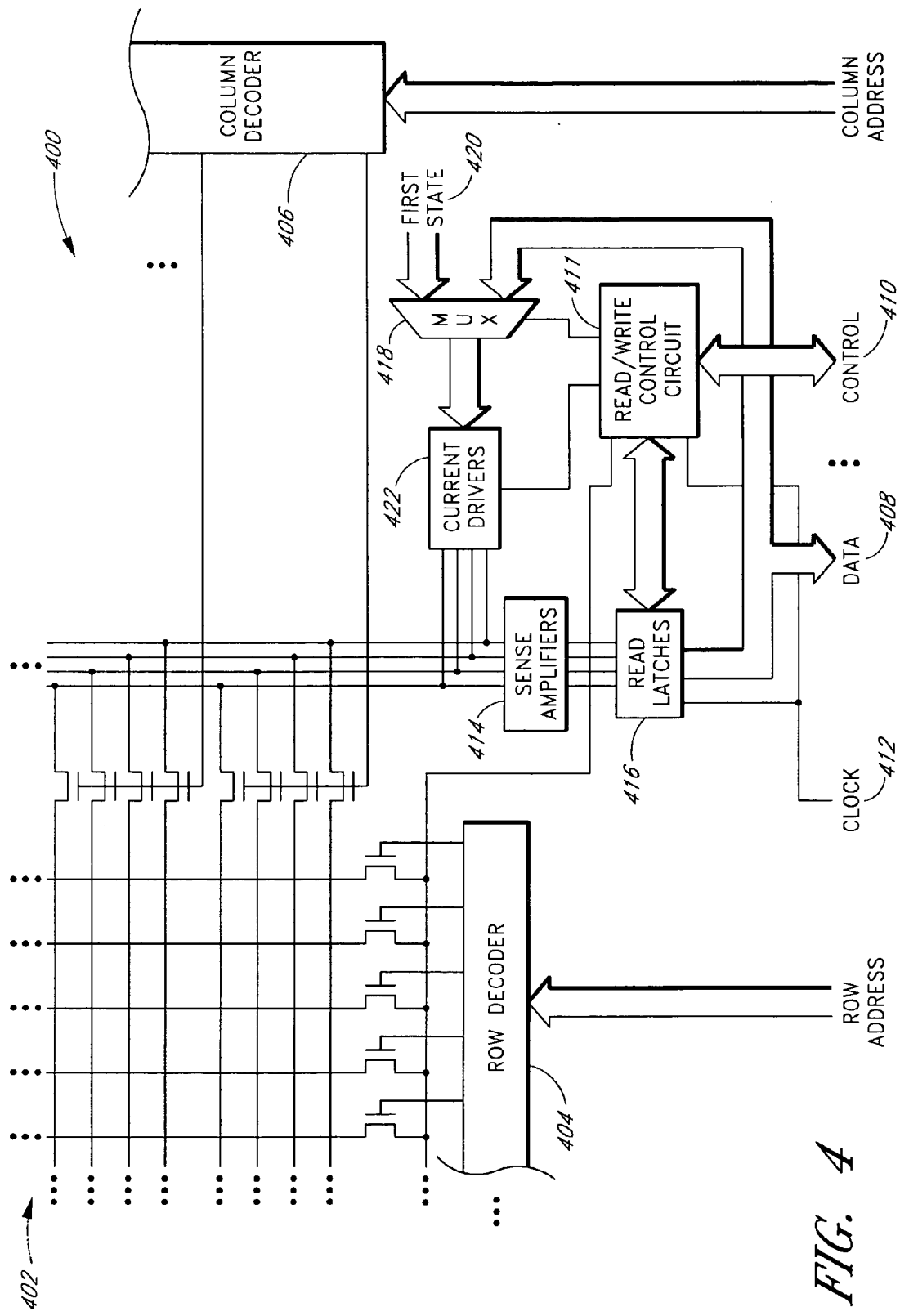
FIG. 4 is a schematic diagram of a memory device according to one embodiment.

FIG. 4 is a schematic diagram of a memory device 400 according to one embodiment. It will be understood that the memory device 400 can be varied in a broad variety of ways, such as, for example, the addition of components and the deletion of components. For clarity, power, ground, address latches, buffer circuits, and the like are not shown. While illustrated in the context of synchronous memory, it will be apparent that control signals can also be provided by the bus controller 106 or other circuit for an asynchronous memory. One embodiment corresponds to a controller, such as to a bus controller 106 or to a memory controller, that is configured to provide the appropriate control signals to an MRAM memory device to eliminate the wasteful wait state that precedes the write cycle.

The magnetoresistive cells can correspond to giant magneto-resistance (GMR) cells, to pseudo spin valve (PSV), to magnetic tunnel junction (MTJ) cells, and the like. In one embodiment, the magnetoresistive cells of the memory device 400 are arranged in a memory array 402 in rows and columns. For example, where GMR or PSV cells are used, groups of the cells can be electrically coupled in series in a conductive line, which can be referred to as a "sense" line or as a "bit" line. The sense line or bit line can correspond to either a row or a column. Word lines are positioned generally orthogonal to the sense lines and are used to select a cell or bit from a sense line. Some configurations of MRAM cells also use additional lines, referred to herein as "digit" lines, when writing data to an MRAM cell. In another example, MTJ cells can be arranged in a "cross point" architecture. In this architecture, the MTJ cells are disposed between one set of parallel conductive lines and another set of parallel conductive lines approximately orthogonal to the first. The lines are referred to as bit and word lines, column and row lines, and the like. It will be understood that other labels can be used to describe these conductive lines.

The address provided to the memory device 400 determines which cells of the memory array 402 are selected for a read operation or for a write operation. In one embodiment, selected address lines from the address bus 114 are latched with an address latch (not shown), and portions of the latched address are provided as row address inputs and as column address inputs to a row decoder 404 and to a column decoder 406, respectively. In one embodiment, the relatively higher address bits are used as a row address, and the relatively lower address bits are used as a column address.

At least a portion of the data bus 116 is electrically coupled to the data lines 408 of the memory device 400. As discussed above, the data size or width of the data lines 408 is typically referred to as a "word". For example, a 4-bit word is typically referred to as a "nibble", and an 8-bit word is typically referred to as a "byte". It should be apparent that the size of a word for a computer or other digital device can be different than the size of a word for a memory device used by the computer. For example, where the data bus 116 is 32 bits wide and the width of the data lines 408 is 8 bits, the digital device 100 can have four memory devices in parallel to cover the 32-bit wide data bus.

Selected control signals 410 from the control signals 118 operate to at least partially control the memory device 400 via a read/write control circuit 411. The selected control signals 410 can include one or more control signals such as an output enable, a chip select, an address latch, a read command, a write command, a read/write command, activation signals for current drivers, reset signals for read latches, and the like. For example, the read/write control circuit 411 provides internal control signals to various circuits such as output enable signals to tri-state gates, input select signals to multiplexers, latch enable signals to latches, and the like. It will be understood that such signals can correspond to active low or to active high signals. In the illustrated embodiment, where a synchronous memory is described, the control signals can further be latched by an edge, such as a rising edge or a falling edge, of a clock signal 412.

In response to a read request, the row decoder 404 and the column decoder 406 select the applicable portion, termed "selected word", of the memory array 402. Sense amplifiers 414 detect the logical values of the stored states. The sense amplifiers 414 are coupled to read latches 416, which latch the data to a stable state. In one embodiment, the sense amplifiers 414 and the read latches 416 are integrated together with a cross-coupled latch circuit. It will be understood that the output of the read latches 416 can be coupled to a tri-state buffer (not shown) and then electrically coupled to the data lines 408. In one embodiment, the tri-state buffer asserts the data onto the data bus 116 at least partially in response to a combination of chip select, read command, and output enable control signals.

A conventional MRAM device waits to receive the data to be written before initiating a write of the data to a memory array. Unlike a conventional memory device, the illustrated memory device 400 advantageously begins the process of writing data to the memory array 402 before the data from the data bus 116 has been received, thereby advantageously reducing the time otherwise required to complete a memory write cycle.

In response to a write request, the row decoder 404 and the column decoder 406 select the applicable portion (e.g., word) of the memory array 402. The process of writing to the memory array 402 proceeds in two phases to accommodate the two directions of current used for writing a value of logic "0" and for writing a value of logic "1" to the memory array 402. It should be noted that in writing a logic state to an MRAM cell, a plurality of currents in separate conductors can be used so that the magnetic field used to store data can correspond to a vector sum of the magnetic fields from the plurality of lines carrying current. In addition, it should be noted that a write current for writing a value of logic "0" can be, but does not have to be, the same as a write current that is used for writing a value of logic "1". In the accompanying timing diagram of FIG. 3, the first phase 316 is initiated by a rising edge of the clock waveform 302, and the second phase 318 is initiated by a falling edge of the clock waveform 302. It will be understood that in another embodiment, the falling edge can be used to initiate the first phase 316 and the rising edge can be used to initiate the second phase 318.

In the first phase 316, a multiplexer (MUX) 418 selects a first state 420, which can be provided from a first input. At least partially in response to a control, the multiplexer selects between a first input and a second input and provides the selected input as an output. It will be understood that since the first state 420 can be a constant, the first input can be hardwired for the logical value of the first state 420. The first state 420 advantageously corresponds to a logic "0" or to a logic "1" for all bits and corresponds to the value of the data that is written during the first phase 316. The first state 420 is provided as an input to current drivers 422, thereby writing the first state to all of the selected memory cells regardless of the actual value of the data to be stored during the second phase. It will be understood that the multiplexer 418 and the current drivers 422 can be at least partially integrated together, so that, for example, instead of using the multiplexer 418, the current drivers 422 can be configured to route current for all of the selected cells of the memory array 402 in a first direction during the first phase 316.

The data is available on the data bus 116 by the time the second phase 318 begins. In the second phase 318, the multiplexer 418 selects the data lines 408 as the input, and the multiplexer 418 provides the data as an input to the current drivers 422. For example, the data lines 408 can be electrically coupled to a second input of the multiplexer 418. Selectively and according to the values for the data, the current drivers 422 write a second state of data to the memory array, where the second state is the logical inverse of the first state.

In one example, the data lines 408 are 4-bits wide, the first state is logic "0", and a value of 010(binary) is to be written to the memory array 402. The binary data (bits) will be referenced herein as $d_3d_2d_1d_0$. In the first phase 316, the memory device 400 stores a value of 0000(binary) to the selected word of the memory array 402 so that all the bits $d_3d_2d_1d_0$ have the value of logic "0". During the second phase 318, the memory device 400 writes a value of logic "1" only to bits $d_2$ and $d_0$, so that when the memory write cycle is complete, the memory device 400 has correctly stored the value of 0101(binary) to the selected word. By initiating the write cycle before the data has been received, the memory device 400 can advantageously eliminate at least one wait state, thereby speeding access to the memory device 400 and the overall performance of a corresponding digital device.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

I claim:

1. A method of writing data in a magnetic random access memory (MRAM), where the MRAM includes a magnetoresistive array of bits, where a bit from the magnetoresistive array stores one of a first state or a second state, where the second state is a logical inverse of the first state, the method comprising:
   receiving an address, where the address corresponds to selected bits of a magnetoresistive array within the MRAM;
   receiving a control signal to perform a write operation for the selected bits;
   writing the first state to all of the selected bits of the magnetoresistive array at least partially in response to receiving the control signal;
   inputting a word of data intended to be written to the selected bits of the magnetoresistive array at least partially in response to receiving the control signal; and
   selectively overwriting zero or more of the selected bits, where the zero or more of the selected bits correspond to zero or more bits of the word that have the second state.

2. The method as defined in claim 1, wherein writing the first state comprises activating a write current in a first direction for the selected bits.

3. The method as defined in claim 2, wherein selectively overwriting comprises activating a write current in a second direction opposite to the first direction.

4. The method as defined in claim 1, wherein writing the first state to the selected bits is conducted in response to a first edge of a clock signal.

5. The method as defined in claim 1, wherein writing the first state to the selected bits of the magnetoresistive array is conducted before inputting the word of data to be written.

6. The method as defined in claim 1, wherein reading the word of data intended to be written to the selected bits of the magnetoresistive array is conducted at least partially in response to a second edge of a clock signal.

7. The method as defined in claim 1, wherein reading the word of data intended to be written to the selected bits of the magnetoresistive array is conducted a predetermined time after a first edge of a clock signal.

8. The method as defined in claim 1, wherein the MRAM is embodied in a memory device.

9. The method as defined in claim 1, wherein the MRAM is embodied in a controller.

10. The method as defined in claim 1, wherein the MRAM is embodied in a removable memory card.

11. The method as defined in claim 1, wherein the MRAM is embodied in a digital device.

12. A method of exchanging data in a magnetic random access memory (MRAM), the method comprising:
   reading data from the MRAM in a read cycle; and
   writing data to the MRAM in a write cycle, where the write cycle immediately follows the read cycle without a wait state between the read cycle and the write cycle, wherein writing data further comprises at least a first phase and a second phase, where in the first phase, a first state of data is written to all bits of a selected portion of the MRAM, and where in the second phase, a second state of data is overwritten over selected bits of the selected portion of the MRAM, where the selected bits correspond to data provided to the MRAM for storage.

13. The method as defined in claim 12, wherein the MRAM is embodied in a memory device.

14. The method as defined in claim 12, wherein the MRAM is embodied in a digital device.

15. A method of exchanging data in a magnetic random access memory (MRAM), the method comprising:
   reading data from the MRAM in a read cycle; and
   writing data to the MRAM in a write cycle, where the write cycle immediately follows the read cycle without a wait state between the read cycle and the write cycle, wherein writing data comprises:
   writing a first state of data to a selected portion of the MRAM, where the selected portion corresponds to a memory address;
   inputting the data to be written to the MRAM, where the data to be written corresponds to bits of data having a value of the first state or a second state; and
   writing the second state of data to selected bits of the selected portion of the MRAM, where the selected bits correspond to bits of the data to be written to the value of the second state.

16. The method as defined in claim 15, wherein the MRAM is embodied in a digital device.

17. An integrated circuit with a magnetic random access memory (MRAM) comprising:
   a memory array of magnetoresistive cells, a magnetoresistive cell being configured to store one of a first state or a second state;
   a decoder electrically coupled to the memory array, the decoder being configured to select a selected portion of the memory array at least partially in response to a provided address;
   current drivers electrically coupled to the selected portion of the memory array, the current drivers being configured to provide at least a write current in a first direction for writing a first state of data and to provide at least a write current in a second direction for selectively writing a second state of data to selected bits of the selected portion; and
   a read/write control circuit configured to receive and respond to control signals for the MRAM and to activate the current drivers to write the first state of data to all of the bits of the selected portion in a first phase and to selectively write the second state of data to the selected bits of the selected portion in a second phase, the selected bits comprising zero or more bits corresponding to bits having the second state in a word received by the MRAM.

18. The integrated circuit as defined in claim 17, further comprising sense amplifiers electrically coupled to the selected portion of the memory array, the sense amplifiers being configured to retrieve a stored state from the selected word.

19. The integrated circuit as defined in claim 17, wherein the read/write control circuit is further configured to receive a clock signal, wherein the first phase is initiated at least partially in response to one of a rising edge or a falling edge of the clock signal, and where the second phase is initiated at least partially in response to the other of the rising edge or the falling edge of the clock signal.

20. The integrated circuit as defined in claim 17, further comprising a multiplexer having a first input set to the first state, having a second input that receives a data input of the MRAM, having a control input, and having an output that is coupled to inputs of the current drivers, the multiplexer being configured to selectively transfer one of the first state on the first input or the data input on the second input to the output coupled to the inputs of the current drivers, the control input of the multiplexer being electrically coupled to the read/write control circuit so that the multiplexer provides the first state to the inputs of the current drivers in the first phase and provides the data input of the M.RAM as the inputs of the current drivers in the second phase.

21. The integrated circuit as defined in claim 17, wherein the decoder further comprises a column decoder and a row decoder.

22. The integrated circuit as defined in claim 17, wherein the integrated circuit is a dedicated memory device.

23. The integrated circuit as defined in claim 17, wherein the integrated circuit is embodied in a digital audio player.

24. A bus controller for a digital device, the bus controller comprising:
a first interface circuit in communication with a processor and with a clock, the first interface circuit receiving first control signals from the processor; and
a second interface circuit at least partially responsive to the first control signals received by the first interface circuit, the second interface circuit being adapted to provide second control signals at least to a magnetic random access memory (MRAM), wherein at least partially in response to an assertion of a processor memory write signal for the MRAM from the processor, where the second interface circuit is configured to assert a controller memory write signal to the MRAM prior to a time when data to be written to the MRAM is valid on a data bus for the MRAM.

25. The bus controller as defined in claim 24, wherein when the processor commands a read from the MRAM followed by a write to the MRAM, the second interface circuit asserts a memory read signal to initiate an MRAM read cycle and then asserts the controller memory write signal to the MRAM immediately following the MRAM read cycle without insertion of a wait state.

26. The bus controller as defined in claim 24, wherein the MRAM corresponds to asynchronous MRAM, and wherein the bus controller is further configured to provide a second controller memory write signal subsequent to the time when the data to be written to the MRAM is valid on the data bus for the MRAM.

27. The bus controller as defined in claim 24, wherein the bus controller is embodied in a chipset.

28. A system, comprising:
a control unit for performing a series of instructions; and
a magnetic random access memory (MRAM) responsive to the control unit, the memory comprising:
a memory array of magnetoresistive cells, a magnetoresistive cell configured to store one of a first state or a second state; and
a control circuit configured to receive control signals for the MRAM, the control circuit configured to be at least partially responsive to an assertion of a memory write signal to store the first state to all of the bits of a selected word of the memory array in a first phase, and to selectively store the second state of data to zero or more of the bits of the selected word of the memory array in a second phase according to a state of data for corresponding bits in a received word of the MRAM to be written to the MRAM.

29. A computer system comprising:
a processor;
at least one storage device in communication with the processor;
at least one input/output device in communication with the processor;
a magnetic memory device in communication with the processor, the magnetic memory device configured to write a first state to a word of a magnetoresistive array irrespective of data to be stored therein; to input data intended to be written to the word of the magnetoresistive array; and to selectively overwrite zero or more bits of the word of the magnetoresistive array, where the zero or more bits correspond to zero or more bits of data intended to be written that correspond to the second state.

* * * * *